(12) United States Patent
Chetlur et al.

(10) Patent No.: US 6,605,529 B2
(45) Date of Patent: Aug. 12, 2003

(54) METHOD OF CREATING HYDROGEN ISOTOPE RESERVOIRS IN A SEMICONDUCTOR DEVICE

(75) Inventors: Sundar Chetlur, Singapore (SG); Jennifer M. McKinley, Orlando, FL (US); Minesh A. Patel, Orlando, FL (US); Pradip K. Roy, Orlando, FL (US); Jonathan Zhong-Ning Zhou, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 82 days.

(21) Appl. No.: 09/853,317

(22) Filed: May 11, 2001

(65) Prior Publication Data

US 2002/0168841 A1 Nov. 14, 2002

(51) Int. Cl.⁷ .......................................... H01L 21/4763
(52) U.S. Cl. .................. 438/627; 438/585; 438/643; 438/795
(58) Field of Search .................... 438/585, 770, 438/787, 627, 643, 648, 649, 795, 799

(56) References Cited

U.S. PATENT DOCUMENTS

| 4,851,370 A | * | 7/1989 | Doklan et al. .............. 257/411 |
| 5,248,348 A | | 9/1993 | Miyachi et al. |
| 5,646,050 A | | 7/1997 | Li et al. |
| 6,187,665 B1 | * | 2/2001 | Chetlur et al. .............. 438/585 |
| 6,281,138 B1 | * | 8/2001 | Brady et al. ................ 257/410 |

FOREIGN PATENT DOCUMENTS

| JP | 64-41211 | 2/1989 |
| JP | 01-211970 | 8/1989 |
| WO | WO 94/19829 | 1/1994 |

OTHER PUBLICATIONS

J.W. Lyding; K. Hess and I.C. Kizilyalli; "Reduction of Hot Electron Degradation in Metal Oxide Semiconductor Transistors By Deuterium Processing"; Appl. Phys. Lett. 88; Apr. 1996; pp. 2526–2528.

G. Ganguly, A. Suzuki, S. Yamasaki; K. Nomoto and A. Matsuda; "Reduced Light–Induced Changes of Photoconductivity In Duterated Amorphous Silicon"; J. Appl. Phys. 68 (7); Oct. 1990; pp. 3738–3740.

N.M. Johnson, D.K. Biegelsen and M.D. Moyer; "Deuterium Passivation of Grain–Boundary Dangling Bonds In Silicon Thin Films"; Appl. Phys. Lett. 40(10); May 1982; pp. 882–884.

Yasutake Toyoshima, Akihisa Matsuda and Kazuo Arai; "In–Situ Investigation of the Growing a–Si:D Surface By Infrared Reflection Absorption Spectroscopy"; Journal of Non–Crystalline Solids; 1993; pp. 103–106.

Shigenobu Hayashi, Kikuko Hayamizu, Satoshi Mashima, Atsushi Suzuki, Peter J. Mcelheny, Satoshi Yamasaki and Akihisa Matsuda; 2D and 1H Nuclear Magnetic Resonance Study of Deuterated Amorphous Silicon and Partially Deuterated Hydrogenated Amorphous Silicon; Japanese Journal of Applied Physics, vol. 30, No. 9A; Sep. 1991; pp. 1909–1914.

Saks et al., The Time–Dependence of Post–Irradiation Interface Trap Build–Up In Deuterium Annealed Oxides, IEEE Transactions on Nuclear Science, vol. 39, No. 6, pp. 2220–2229.

Ohji et al., Effects of Minutes Impurities (H, OH, F) on SiO/sub2//Si Interface As Investigated By Nuclear Resonant Reaction and Electron Spin Resonance; IEEE Transactions on Electron Devices, vol. 37, No. 7, pp. 1635–1642.

* cited by examiner

Primary Examiner—Amir Zarabian
Assistant Examiner—Khanh B. Duong

(57) ABSTRACT

The present invention provides a method of manufacturing a semiconductor device that includes incorporation of a hydrogen isotope at a relatively high processing temperature during gate oxidation or polysilicon gate electrode deposition to maximize incorporation of hydrogen isotope at interfaces deliberately created during oxidation (such as graded oxidation) as multilayered poly/alpha-silicon deposition process.

22 Claims, 3 Drawing Sheets

METHOD OF CREATING HYDROGEN ISOTOPE RESERVOIRS IN A SEMICONDUCTOR DEVICE

TECHNICAL FIELD OF THE INVENTION

The present invention is directed, in general, to a method of manufacturing a semiconductor device and, more specifically, to a method of creating a hydrogen isotope reservoir in the semiconductor device at a relatively higher processing temperature to maximize retention of the hydrogen isotope during subsequent processing steps. This allows device to perform without any drift in transistor characteristics under hot-carrier aging (HCA).

BACKGROUND OF THE INVENTION

The use of silicon in semiconductor devices, such as metal-oxide-semiconductor-field-effect-transistor ("MOSFET"), well known. Equally well known is the degradation of these devices, under hot carrier stressing. A result of hot electron emission into the gate oxide is electron trapping with the oxide. Typical silicon dioxide films trap only about one percent of the total number of injected electrons. Electron trapping, of course, results in a negative charge accumulation within the gate oxide and thus will eventually change the MOSFET behavior. Specifically, the addition of negative charge raises the MOSFET threshold voltage since more positive gate bias is required to overcome the negative oxide charge. Increased threshold voltage is detrimental since the MOSFET current drive decreases. The degradation in MOSFET performance is minimal in the saturation regime and much more pronounced either in the linear regime or with source and drain terminals reversed so that the hot electron damage is localized at the source end of the channel.

Quite intriguing is the well-known result that hot electron degradation consists also of interface states. Interface states are electron energy states within the forbidden silicon band gap at the silicon-silicon dioxide interface. These states are detrimental since they can temporarily trap charge and thus change MOSFET characteristics or reduce charge carrier mobility within the channel. Charge pumping and low-frequency noise measurements have confirmed the localized nature of these surface states. In addition to increased threshold voltage, another result of hot electron degradation is reduced linear region transconductance. In fact, it is more common to report transconductance data since the parameter tends to degrade before one observes any changes in threshold voltage. Transconductance degradation is often loosely explained by channel mobility reduction due to surface state generation, but modeling studies have shown that localized electron trapping can also explain the loss in transconductance. Channel hot electron degradation increases in severity as the n-channel MOSFET channel length decreases. As we noted previously, hot electron injection is a strong (exponential) function of the mean electron energy, and this mean energy increases with increasing electric field. One specifies reduced channel length, gate oxide thickness, and source-drain junction depth, as well as increased channel acceptor impurity concentration. All of these modifications act to increase the maximum electric field in the channel and thus exacerbate the hot electron problem.

With respect to interface traps, it is believed that the interface traps are caused by defects that are generated by current flow in such semiconductor devices. It is further believed that these defect states reduce the mobility and lifetime of the carriers and cause degradation of the device's performance. In most cases, the substrate comprises silicon, and the defects are thought to be caused by dangling bonds (i.e., unsaturated silicon bonds) that introduce states in the energy gap, which remove charge carriers or add unwanted charge carriers in the device, depending in part on the applied bias. To alleviate the problems caused by such dangling bonds, a passivation process of hydrogen isotopes has been adopted and established in the fabrication of such devices.

In the hydrogen/deuterium passivation process, it is thought that the defects that affect the operation of semiconductor devices are removed when the deuterium bonds with the silicon at the dangling bond sites. In order to impregnate the semiconductor devices with hydrogen and deuterium, at a higher concentration, a high temperature process such as gate oxidation or poly deposition is adopted where hydrogen isotope is introduced during oxidation or poly deposition at energetically favorable sites such as interfaces within the oxide or within the poly gate electrode layers. Frequently, the hydrogen or deuterium that is pumped into the semiconductor device diffuses out during subsequent thermal processing. Thus, while the hydrogen/deuterium passivation process eliminates the immediate problem associated with dangling silicon bonds, it does not eliminate degradation permanently because the hydrogen/deuterium atoms that are added by the passivation process can be "desorbed" or removed from the previous dangling bond sites by the next thermal process or under hot-carrier aging.

A hot carrier is an electron that has a high kinetic energy, which is imparted to it when voltages are applied to electrodes of the device. Under such operating conditions, the hydrogen/deuterium atoms, which were added by the passivation process, are knocked off by the hot electrons. This hydrogen/deuterium desorption results in aging or degradation of the device's performance. According to established theory, this aging process occurs as a result of hot carriers stimulating the desorption of the hydrogen from the silicon substrate's surface or the silicon dioxide interface. This hot carrier effect is particularly of concern with respect to smaller devices in which proportionally larger electric fields can be used.

Accordingly, what is needed in the art is a semiconductor device and a method of manufacture therefore that addresses the deficiencies of the prior art.

SUMMARY OF THE INVENTION

To address the above-discussed deficiencies of the prior art, the present invention provides a method of manufacturing a semiconductor device. In an advantageous embodiment, the method includes creating a hydrogen isotope sink within a semiconductor material located on a semiconductor substrate by oscillating a deposition parameter during a formation of the semiconductor material and incorporating a hydrogen isotope, such as deuterium, into the semiconductor material at the interface created by the oscillation. The hydrogen may be incorporated either during or after the step of creating a hydrogen isotope sink.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
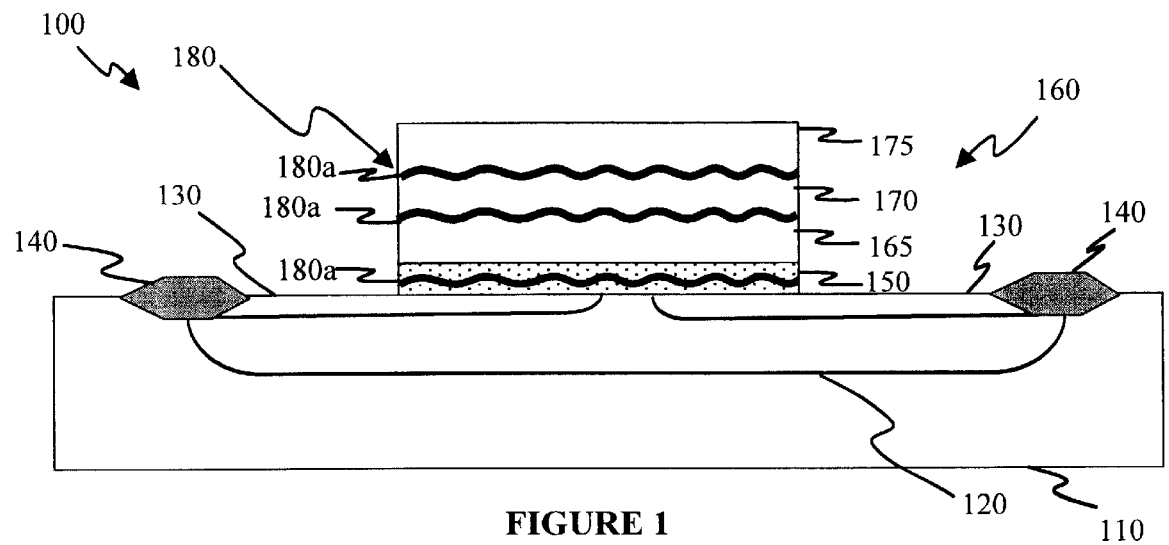
FIG. 1 illustrates a partial sectional view of a transistor device provided by the present invention.

Turning now to FIG. 1, illustrated is a partial sectional view of one embodiment of a transistor device 100 in accordance with the principles of the present invention. The transistor device 100 includes a semiconductor substrate 110, such as an epitaxial layer, a tub 120 formed in the semiconductor substrate 110, source/drain regions 130 and field oxide regions 140, all of which can be formed with conventional processes and materials. In addition, the transistor device 100 further includes a gate oxide 150 over which a gate 160 is formed. The gate oxide 150 and the gate 160 may be formed from conventional materials, such as silicon dioxide and polysilicon, respectively. However, the way in which these materials can be deposited in the present invention depart significantly from conventional processes. Uniquely, in the embodiment illustrated in FIG. 1, the gate 160 may include first, second and third gate layers 165, 170 and 175 that have interfaces 180 between them that serve as isotope sinks 180a for isotopes of elemental hydrogen, such as deuterium or tritium. While three different layers have been shown, it should be understood that the present invention also provides for either more or less layers having the unique interface 180 or isotope sink 180a between the multiple layers. In fact, it is believed that the greater the number of layers, the greater the isotope withholding capabilities of the hydrogen isotope sink, as long as the layers do not extend the overall thickness beyond desired parameters.

The isotope may be incorporated into the isotope sink 180 in situ while forming the layers, or, alternatively, after the semiconductor is manufactured. To further enhance hydrogen isotope incorporation during the cool down process of front end semiconductor fabrication, conventional nitrogen may be replaced with isotope. Although the cool down process is conventionally performed at 300° C. rather than at a preferred higher temperature, enhanced isotope incorporation is still achieved by further passivation of the isotope sinks 180. An isotope sink 180a is also shown in the gate oxide layer 150. The way in which this is formed in discussed in more detail below.

The hydrogen isotope sink can be any interface, whether virtual or real, that exists within the semiconductor device, and it can be created by oscillating a number of deposition parameters. For instance, in one embodiment, the hydrogen isotope sink may be created by oscillating a deposition rate of the same material. In such embodiments, the oscillation creates a virtual interface between the sublayers of the same material. The virtual interface arises from the fact that layers that are deposited at different rates have different grain sizes at their interface. In another embodiment, the hydrogen isotope sink may be created by oscillating a temperature during the formation of the device. For example, when forming the gate oxide, a first oxide layer may be formed at a lower temperature followed by the formation of a second oxide layer under the first oxide layer at a higher temperature.

In an advantageous embodiment, the isotope sink 180a is essentially a virtual interface between semiconductor materials that is passivated with a hydrogen isotope as defined above. However, in other embodiments, the isotope sink 180a may be an actual interface. As previously mentioned, the materials used to passivate the isotope sink 180a may include deuterium and tritium; in an advantageous embodiment, however, deuterium is used.

In exemplary embodiments, the present invention provides for incorporating the isotope into the isotope sink 180a at a temperature ranging from about 600° C. to about 1100° C. Passivation at these high temperatures facilitates isotope retention within the semiconductor device. Specifically, isotope retention is facilitated by creating isotope sinks 180a that trap the isotope. Due to the presence of the isotope sinks 180a, isotope desorption is substantially retarded when compared to conventional structures. Therefore, a higher concentration of isotope may be retained within the semiconductor device, which advantageously reduces the level of efficiency degradation experienced by the devices that are incorporated with conventional hydrogen/deuterium passivation processes. The hydrogen isotope sink 180a is created by periodically oscillating one or more of any selected growth parameters during a formation of the semiconductor material layers 165, 170, 175 and incorporating the isotope into the semiconductor material at the interface 180.

There are several methods by which to create the interfaces 180. In one embodiment, the isotope sink 180a is created by oscillating a deposition parameter, such as a deposition rate, a deposition temperature, a deposition pressure, or a combination of any of these.

For instance, in one embodiment, the isotope sink 180 may be created by oscillating a deposition rate of a semiconductor material. In one embodiment, the hydrogen isotope sink may be created by a grow-deposit-grow scheme. For example, when forming the gate oxide, a first oxide layer may be grown in a zone of low pressure, a second layer may be deposited on the first oxide layer in the zone of low pressure and a another oxide layer may be grown under the first oxide layer in the same zone of low pressure.

In one specific embodiment, the oscillation process is performed by depositing polysilicon at a first deposition rate to form a first semiconductor material layer and subsequently depositing polysilicon on the first semiconductor material layer at a second deposition rate, which forms a second semiconductor material layer. By deliberate oscillation in deposition rate, sublayers are created within the semiconductor material layers that forms virtual interfaces to create the isotope sinks 180. The virtual interfaces are created within the same semiconductor material, but each layer is successively formed over the other at a rate different than the one before it. By depositing the semiconductor material at different rates, it is believed that different grain sizes of semiconductor material will meet at the interface. The isotope may be incorporated subsequent to the deposition process, or it may be incorporated during the deposition process. In the embodiment where the isotope is incorporated after the deposition process, a post deposition anneal of the deposited material may be conducted in a separate furnace. Alternatively, the isotope may be incorporated during the deposition of the material. In one aspect of this embodiment, the semiconductor structure may be annealed in the same furnace as the deposited materials. The isotope may be incorporated by flowing the deuterium at a rate ranging from about 4 to about 5 liters per minute. Further details of the above-described deposition scheme can be found in U.S. Pat. No. 4,742,020, which is incorporated herein by reference.

Figure 2:
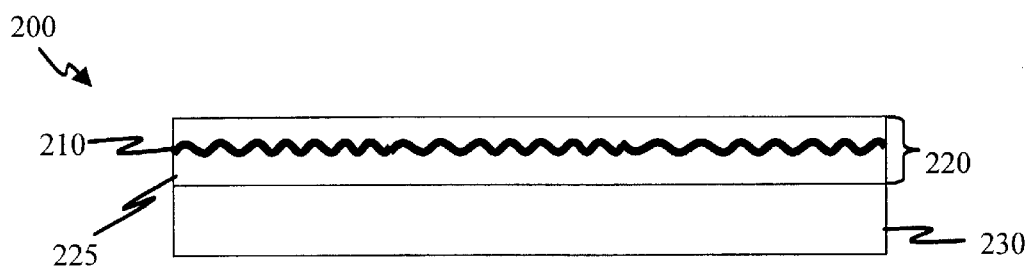
FIG. 2 illustrates a partial sectional view of a gate oxide structure where the isotope sink may be formed by oscillating a deposition temperature during the gate oxide's formation.

The isotope sinks 180 may also be created by oscillating a deposition temperature of the semiconductor material, such as a gate oxide. Turning to FIG. 2, illustrated is an exemplary embodiment of a gate oxide structure 200 that can be formed by oscillating a deposition temperature parameter to create an isotope sink 210 within the gate oxide structure 200. In this particular embodiment, the isotope sink 210 may be created by oscillating the growth temperature during formation of the oxide material. For example, a first oxide layer 220 is formed at a first growth temperature and a second oxide layer 225 is grown between the first oxide layer 220 and a substrate 230 at a second growth temperature greater than the first growth temperature. In one particular embodiment, the first oxidation temperature is about 750° C. to 850° C. greater and the second oxidation temperature is about 940° C. or greater. More details of this deposition temperature scheme can be found in U.S. patent application Ser. No. 09/481,992, filed Jan. 11, 2000, which is incorporated herein by reference. Either during or after formation of the gate oxide structure 200, the isotope, preferably deuterium, is flowed at a rate ranging from about 4 to 5 liters per minute.

Figure 3:
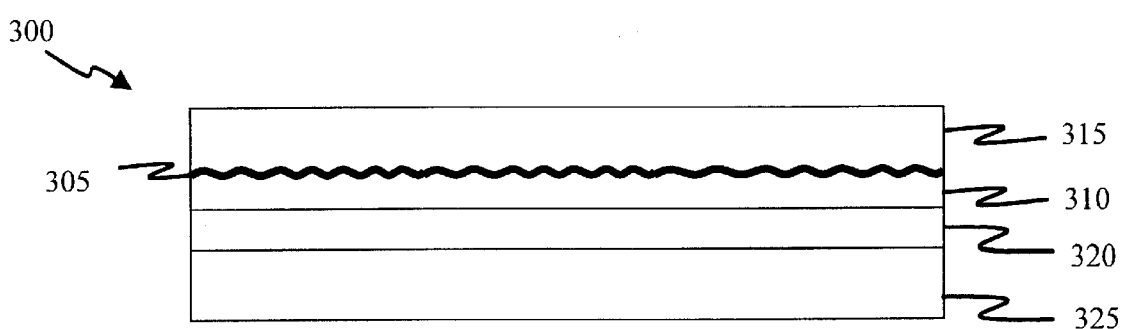
FIG. 3 illustrates a partial sectional view of a gate oxide structure where the isotope sink may be created by oscillating the deposition scheme.

Turning now to FIG. 3, in yet another embodiment, there is illustrated a gate oxide 300 in which an isotope sink 305 may be created by oscillating a deposition scheme used to form the gate oxide 300. In this particular embodiment, oscillation of a deposition parameter includes growing a first oxide layer 310 in a zone of low pressure, later depositing a dielectric layer 315 on the first oxide layer 310 in the same zone of low pressure. A second oxide layer 320 is then grown between the first oxide layer 310 and a semiconductor substrate 325 in the same zone of low pressure. The zone of low pressure may vary, but in an advantageous embodiment, may range from about 200 milliTorr to about 950 milliTorr. It is believed that the low pressure retards the oxidation rate at which the first and second oxide layers 310, 320 are grown. Such retardation of the growth rate is necessary given the thinness and uniformity desired in the dielectric sublayers in sub-micron technologies.

During the third step of growing the second oxide layer 320 between the first oxide layer 310 and the semiconductor substrate 325, an isotope sink 305 is created between the first oxide layer 310 and the deposited dielectric layer 315. Passivation of the gate oxide 300 may then be achieved during or after the semiconductor is manufactured. Because the growth and deposition steps are advantageously performed at a temperature that ranges from about 600° C. to about 750° C., passivation of the gate oxide 300 is advantageously facilitated by trapping the isotope into the isotope sink 305. Either during or after formation of the gate oxide structure 300, the isotope, preferably deuterium, is flowed at a rate ranging from about 4 to about 5 liters per minute.

Figure 4:
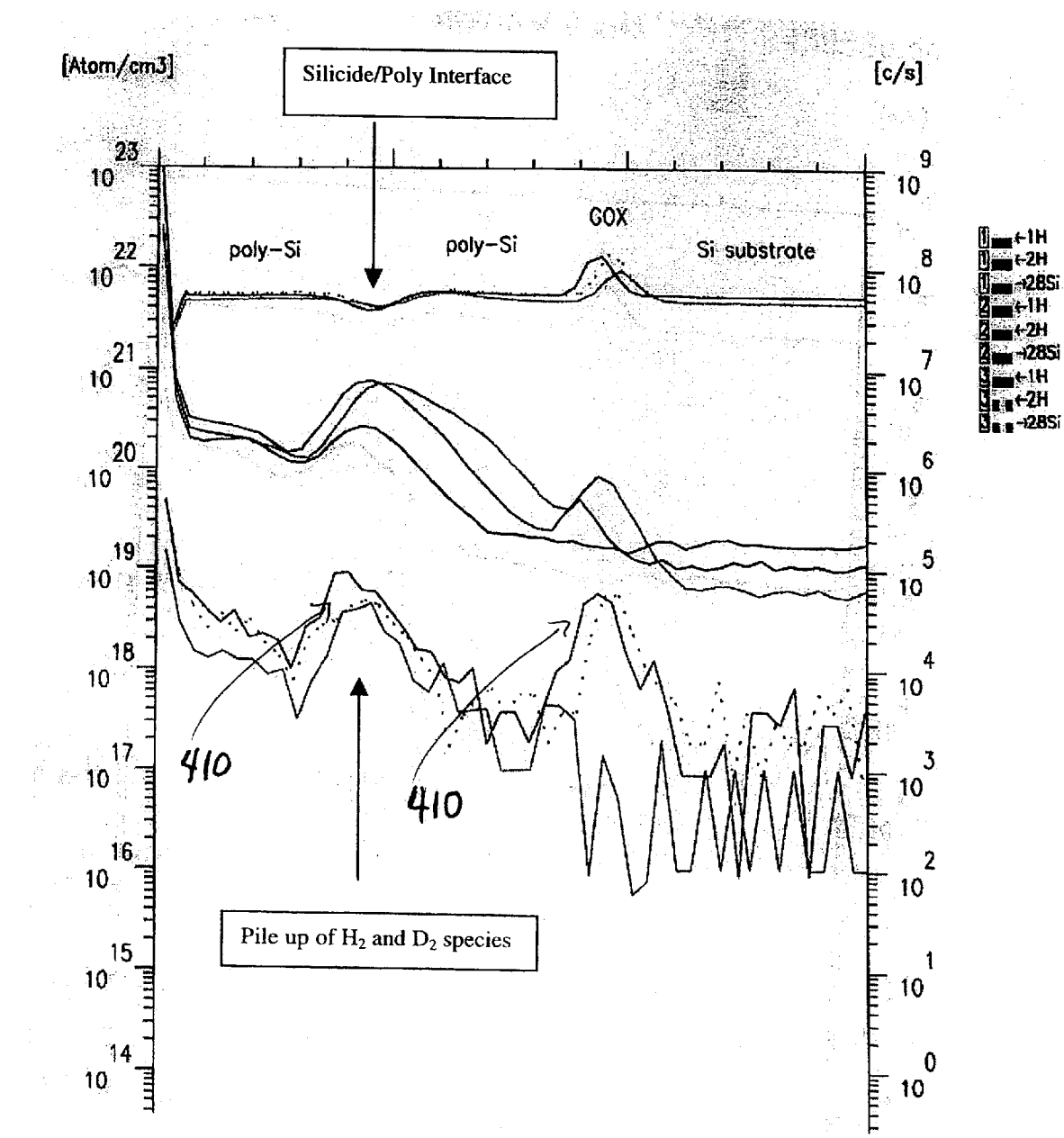
FIG. 4 graphically illustrates data regarding the concentration of hydrogen isotopes at various depths of a semiconductor device.

FIG. 4 graphically illustrates data regarding the concentration of hydrogen isotopes at various layers of a semiconductor device. As illustrated in FIG. 4, the concentration of hydrogen isotopes is significantly higher at the hydrogen isotope sinks 410. Thus, the hydrogen isotope sinks work to lock in the hydrogen isotopes to avoid desorption in subsequent manufacturing processing.

Figure 5:
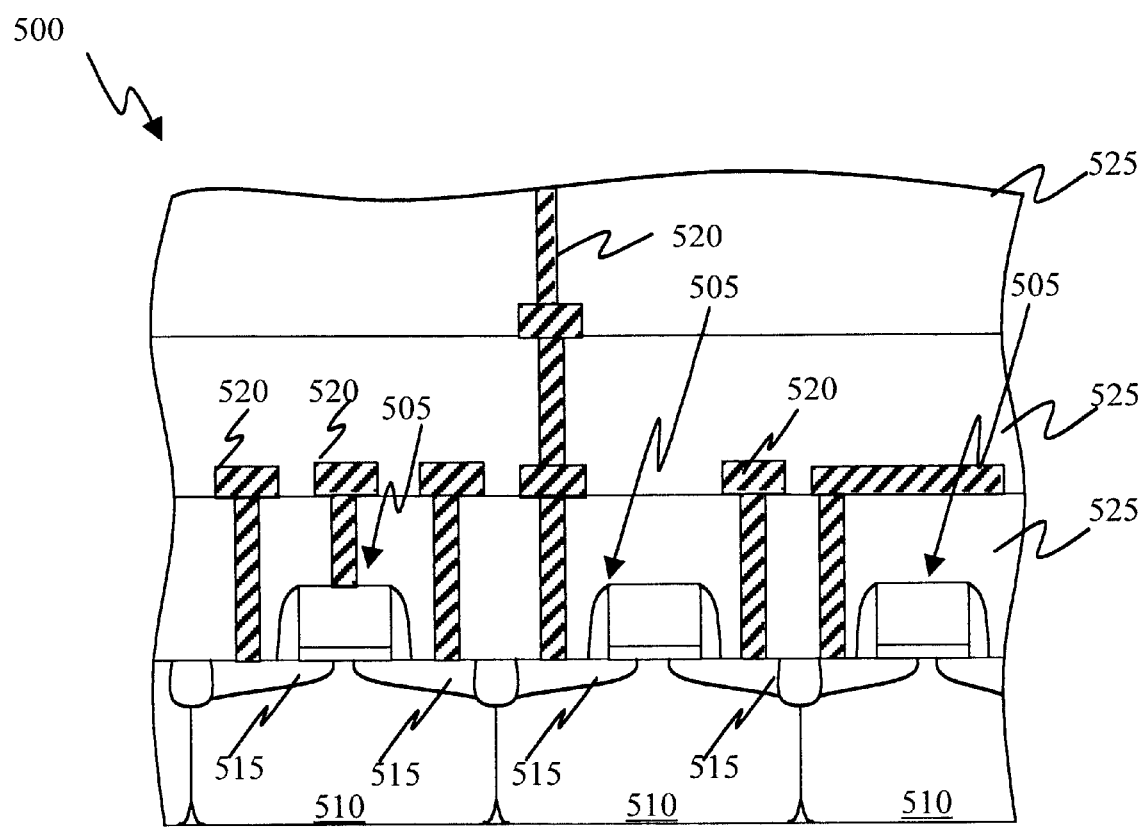
FIG. 5 illustrates a partial sectional view of an integrated circuit incorporating the transistor as provided by the present invention.

Turning now to FIG. 5, there is illustrated a partial sectional view of an integrated circuit 500 into which the transistor device 100 of FIG. 1 may be incorporated. The integrated circuit 500 may include devices, such as complementary metal oxide semiconductor devices, a merged bipolar and complementary metal oxide semiconductor devices, or a bipolar semiconductor devices. In the illustrated embodiment, the integrated circuit 500 includes transistors 505 as provided by the present invention and as discussed above, conventionally formed tubs 510, source/drains 515. The transistors 505 can be interconnected by conventionally formed interconnects 520, which, of course, may be either contact plugs or vias. These interconnects 520 are formed in interlevel dielectric layers 525. One who is skilled in the art knows how to interconnect the transistors 505 using the interconnect 520 to form an operative integrated circuit.

Although the present invention has been described in detail, those skilled in the art should understand that they can make various changes, substitutions and alterations herein without departing from the spirit and scope of the invention in its broadest form.

What is claimed is:

1. A method of manufacturing a semiconductor device, comprising:
    creating a hydrogen isotope sink within a semiconductor gate located over a semiconductor substrate by oscillating a deposition parameter during a formation of the semiconductor gate; and
    incorporating a hydrogen isotope into the semiconductor gate at the sink.

2. The method as recited in claim 1 wherein incorporating includes incorporating deuterium.

3. The method as recited in claim 1 wherein creating includes oscillating a deposition rate of a polysilicon.

4. The method as recited in claim 3 wherein oscillating includes depositing the polysilicon at a first deposition rate to form a first polysilicon layer and depositing the polysilicon on the first polysilicon layer at a second deposition rate to form a second polysilicon layer.

5. The method as recited in claim 4 wherein incorporating includes incorporating the hydrogen isotope subsequent to forming the second polysilicon layer.

6. The method as recited in claim 4 wherein incorporating includes incorporating hydrogen isotope during depositing the polysilicon at the first and second deposition rates.

7. The method as recited in claim 1 wherein incorporating includes incorporating the hydrogen isotope at a temperature ranging from about 600° C. to about 1100° C.

8. The method as recited in claim 1 wherein the semiconductor device further includes an oxide formed by oscillating forming a first oxide layer at a first temperature and forming a second oxide layer under the first oxide layer at a second temperature higher than the first temperature.

9. The method as recited in claim 8 wherein the first temperature is about 750° C. to 850° C. and the second temperature is about 940° C. or greater.

10. The method as recited in claim 1 wherein the semiconductor device further includes an oxide formed by oscillating growing a first oxide layer in a zone of low pressure of less than about 950 mTorr, depositing a dielectric layer on the first oxide layer in the zone of low pressure and growing a second oxide layer between the first oxide layer and the semiconductor substrate in the zone of low pressure.

11. The method as recited in claim 1 wherein creating includes depositing a first semiconductor gate layer and depositing a second semiconductor gate layer on the first semiconductor gate layer.

12. The method as recited in claim 1 wherein incorporating includes flowing the hydrogen isotope at a rate of about 4 to 5 liters per minute.

13. The method as recited in claim 1 wherein incorporating includes incorporating during creating or subsequent to creating.

14. The method as recited in claim 1 further including forming a gate oxide.

15. A method of manufacturing an integrated circuit, comprising:
   creating hydrogen isotope sinks within gate transistor structures located on a semiconductor substrate by oscillating a deposition parameter during a formation of the gate transistor structures; and
   incorporating a hydrogen isotope into the transistor structures.

16. The method as recited in claim 15 wherein incorporating includes incorporating deuterium.

17. The method as recited in claim 15 wherein creating includes oscillating a deposition rate of a polysilicon used to form the gate transistor structures.

18. The method as recited in claim 15 wherein incorporating includes incorporating deuterium at a temperature ranging from about 600° C. to about 1100° C.

19. The method as recited in claim 15 wherein creating further includes depositing first oxide layers at a first temperature and depositing second oxide layers on the first oxide layers at a second temperature less than the first temperature to form gate oxides the gate transistor structures.

20. The method as recited in claim 19 wherein the first temperature is about 750° C. to 850° C. or greater and the second temperature is about 940° C. or higher.

21. The method as recited in claim 19 wherein creating includes growing the first oxide layers in a zone of low pressure of less than about 950 mTorr, depositing the second oxide layers on the first oxide layers in the zone of low pressure and growing the second oxide layers between the first oxide layers and the semiconductor substrate in the zone of low pressure.

22. The method as recited in claim 15 further including depositing interlevel dielectric layers over the gate transistor structures and forming interconnects in the interlevel dielectric layers and interconnecting the transistors to form an operative integrated circuit.

* * * * *